(12) United States Patent
Jung et al.

(10) Patent No.: US 11,518,892 B2
(45) Date of Patent: Dec. 6, 2022

(54) SOLAR CELL AND PASTE COMPOSITION FOR ELECTRODE OF SOLAR CELL

(71) Applicant: LG CHEM, LTD., Seoul (KR)

(72) Inventors: Yongjun Jung, Seoul (KR); Hyeonwoo Jang, Seoul (KR); Junhee Lee, Seoul (KR)

(73) Assignee: LG CHEM, LTD., Seoul (KR)

(*) Notice: Subject to any disclaimer, the term of this patent is extended or adjusted under 35 U.S.C. 154(b) by 0 days.

(21) Appl. No.: 16/696,905

(22) Filed: Nov. 26, 2019

(65) Prior Publication Data

US 2020/0165470 A1 May 28, 2020

(30) Foreign Application Priority Data

Nov. 27, 2018 (KR) .................. 10-2018-0148622

(51) Int. Cl.
*C09D 5/24* (2006.01)
*H01L 31/0224* (2006.01)
*C09D 5/03* (2006.01)
*C09D 101/02* (2006.01)

(52) U.S. Cl.
CPC ............ *C09D 5/24* (2013.01); *C09D 5/033* (2013.01); *C09D 101/02* (2013.01); *H01L 31/022425* (2013.01)

(58) Field of Classification Search
CPC ..... H01L 31/022425; C09D 5/24; C09D 5/33; C09D 101/02
See application file for complete search history.

(56) References Cited

U.S. PATENT DOCUMENTS

| | | | | |
|---|---|---|---|---|
| 2014/0069498 A1* | 3/2014 | Cho | ................... | H01L 31/02168 136/256 |
| 2014/0116507 A1* | 5/2014 | Shim | .................... | H01L 31/068 136/256 |
| 2014/0373913 A1* | 12/2014 | Yang | ........................ | C03C 8/02 136/256 |

FOREIGN PATENT DOCUMENTS

| | | |
|---|---|---|
| CN | 101663711 A | 3/2010 |
| CN | 104795126 A | 7/2015 |
| CN | 108137388 A | 6/2018 |
| EP | 2897131 A1 | 7/2015 |
| EP | 3357878 A1 | 8/2018 |
| JP | 6-227652 A | 8/1994 |
| WO | WO 2008/134417 A1 | 11/2008 |
| WO | WO 2019-103278 A1 | 5/2019 |

* cited by examiner

*Primary Examiner* — Mayla Gonzalez Ramos
(74) *Attorney, Agent, or Firm* — Birch, Stewart, Kolasch & Birch, LLP

(57) ABSTRACT

Discussed is a paste composition for an electrode of a solar cell, the paste including a conductive powder, an organic vehicle, and an inorganic composition formed by including a plurality of metal compounds including a gallium compound including gallium as a component of a main network former of the inorganic composition.

5 Claims, 3 Drawing Sheets

SOLAR CELL AND PASTE COMPOSITION FOR ELECTRODE OF SOLAR CELL

CROSS-REFERENCE TO RELATED APPLICATION

This application claims priority to and the benefit of Korean Patent Application No. 10-2018-0148622 filed in the Korean Intellectual Property Office on Nov. 27, 2018, the entire contents of which are incorporated herein by reference.

BACKGROUND OF THE INVENTION

Field of the Invention

The present disclosure relates to a solar cell, and a paste composition for an electrode of the solar cell, and more particularly, to a solar cell, and a paste composition for an electrode of the solar cell with improved electrode composition.

Description of the Related Art

Solar cells are manufactured by forming various layers and electrodes according to design, and vary in efficiency, stability, and productivity of the solar cells according to materials, designs, and the like of the various layers and electrodes. Here, the electrode is connected to a conductivity type region to transfer electrons and holes to the outside, and should have excellent electrical characteristics and be manufactured in a simple and stable process.

In order to manufacture the electrode in the simple and stable process while maintaining excellent electrical characteristics of the electrode, a method of applying a paste composition and heat treating the paste composition to form the electrode is used. In particular, a fire-through process is used in which the paste composition is formed on a passivation layer formed on the conductivity type region, and the paste composition etches the passivation layer by the heat treatment to be connected to the conductivity type region. At this time, an inorganic composition included in the paste composition serves to etch the passivation layer during the heat treatment, to improve the electrical contact characteristics, and the like. The inorganic composition includes a plurality of metal compounds, and greatly affects the efficiency, characteristics, and the like of the solar cell according to the composition of the inorganic composition.

Accordingly, while simplifying the manufacturing process, it is required to design the composition of the inorganic composition so as not to reduce the electrical characteristics of the electrode and the efficiency of the solar cell.

SUMMARY OF THE INVENTION

The present disclosure is to provide a solar cell that can be formed by a simple and stable manufacturing process and has a uniform efficiency, and a paste composition for an electrode of a solar cell for this.

In particular, the present disclosure is to provide a solar cell that has an electrode having low resistance due to excellent adhesive properties with a conductivity type region, and has a uniform efficiency characteristic. The present disclosure is to provide a paste composition that is used for formation of the electrode of the solar cell, and stably forms an opening in a passivation layer, and can have excellent adhesive characteristics with the conductivity type region while having a low glass transition temperature.

A paste composition for an electrode of a solar cell according to an embodiment of the present disclosure includes an inorganic composition (a glass composition, a glass frit, etc.) including a plurality of metal compounds including a gallium compound including gallium. The paste composition for an electrode of a solar cell can further include a conductive powder (a conductive powder, a conductive material, etc.), an organic vehicle (such as a mixture of organic solvent and organic binder), and the like.

The plurality of metal compounds can further include a lead compound including lead.

At this time, the inorganic composition can be a main network former in which the lead compound and the gallium compound are included in the largest amount (a largest weight portion). For example, a sum of a weight portion of the gallium compound and a weight portion of the lead compound can be 55 or more for a total of 100 weight portion of the inorganic composition.

A weight portion of the lead compound can be equal to or greater than a weight portion of the gallium compound in the inorganic composition. For example, when a sum of a weight portion of the gallium compound and a weight portion of the lead compound is a 100 weight portion, the weight portion of the gallium compound can be 1 to 50 and the weight portion of the lead compound can be 50 to 99. For example, when the sum of the weight portion of the gallium compound and the weight portion of the lead compound is the 100 weight portion, the weight portion of the gallium compound can be 5 to 30 and the weight portion of the lead compound can be 70 to 95. Alternatively, a weight portion of the gallium compound can be 1 to 50 for a total of 100 weight portion of the inorganic composition, and a weight portion of a lead compound can be 30 to 90 for a total of 100 weight portion of the inorganic composition The plurality of metal compounds can further include an additional metal compound other than the gallium compound and the lead compound. A weight portion of the gallium compound can be larger than a weight portion of a first metal compound having a largest weight portion among the additional metal compound. For example, the weight portion of the first metal compound can be 5 to 20 for a total of 100 weight portion of the gallium compound.

The additional metal compound can include at least one of silicon oxide, boron oxide, aluminum oxide, zinc oxide, alkali metal oxide, bismuth oxide.

The inorganic composition can be a glass frit, the plurality of metal compounds each can be composed of a metal oxide, and the conductive powder can be a silver (Ag) powder.

The conductive powder can be included in 70 to 90 weight portion for a total of 100 weight portion of the paste composition for the electrode of the solar cell, and the inorganic composition can be included in 0.1 to 10 weight portion for a total of 100 weight portion of the conductive powder.

A solar cell according to an embodiment of the present disclosure can include an electrode (a current collector, a conductor, a contact part, etc.) made from an inorganic composition including a plurality of metal compounds, for example, a gallium compound including gallium. The electrode can further include a conductive material. The solar cell can further include a photoelectric conversion unit to which the electrode is connected. The photoelectric conversion unit can further include a semiconductor substrate (for example, a silicon substrate), and a conductivity type region (for example, a semiconductor region, a semiconductor layer, etc.) formed in or on the semiconductor substrate, and the electrode can be connected to the conductivity type region.

The plurality of metal compounds can further include a lead compound including lead.

A weight portion of the lead compound can be equal to or greater than a weight portion of the gallium compound in the inorganic composition.

The plurality of metal compounds can further include an additional metal compound other than the gallium compound and a lead compound. A weight portion of the gallium compound can be larger than a weight portion of a first metal compound having a largest weight portion among the additional metal compound.

The inorganic composition can be a glass frit, the plurality of metal compounds each can be composed of a metal oxide, and a conductive material can be silver (Ag).

The paste composition or the electrode of the solar cell formed thereby according to the present embodiment, since the inorganic composition contains a gallium compound, the glass can be stably formed without highly increasing the firing temperature. As a result, adhesion between the electrode and the conductivity type region can be improved, thereby lowering the resistance of the electrode. When the inorganic composition includes a gallium compound together with the lead compound, the passivation layer can be effectively etched, and the stability can be improved by preventing the under calcination of the lead compound, thereby reducing environmental pollution by the lead compound. In addition, the solar cells having electrodes manufactured using such a paste composition can have excellent stability and uniform efficiency characteristics.

DETAILED DESCRIPTION OF THE EMBODIMENTS

Figure 1:
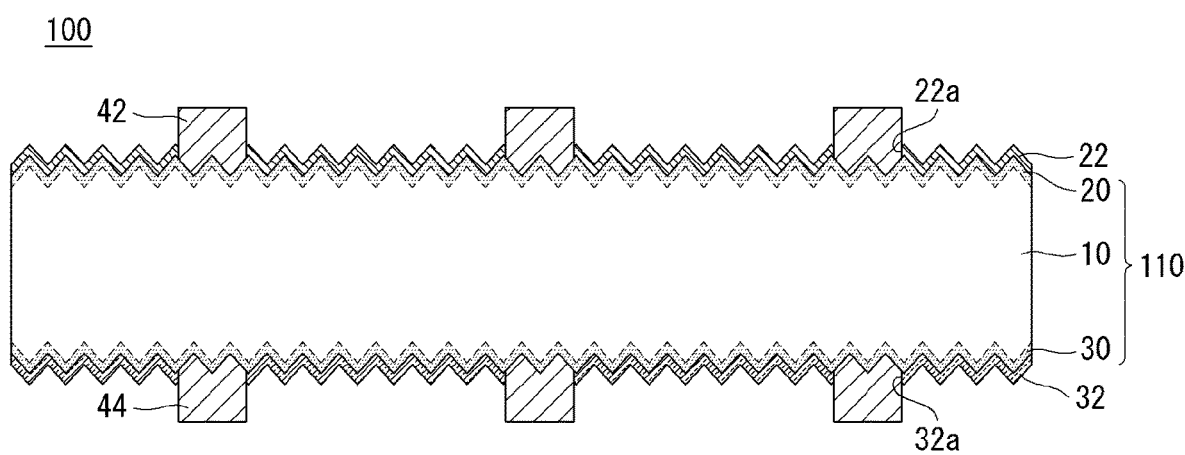
FIG. 1 is a cross-sectional view showing an example of a solar cell according to an embodiment of the present disclosure.

Hereinafter, embodiments of the present disclosure will be described in detail with reference to the accompanying drawings. However, the present disclosure is not limited to these embodiments and can be modified into various forms.

In the drawings, illustration of the parts not related to the description is omitted in order to clarify and briefly describe the present disclosure, and the same reference numerals are used for the same or similar parts throughout the specification. In the drawings, the thickness, width, and the like are enlarged or reduced to make the explanation more clear, and the thickness, width, etc. of the present disclosure are not limited to those shown in the drawings.

When a part is referred to as "including" another part throughout the specification, it does not exclude other parts and can further include other parts unless specifically stated otherwise. Further, when a part of a layer, a film, a region, a plate, or the like is referred to as being "on" other part, this includes not only the case where it is "directly on" the other part but also the case where the other part is positioned in the middle. When the part of the layer, the film, the region, the plate, or the like is referred to as being "directly on" the other part, it means that no other part is positioned in the middle.

Hereinafter, a solar cell and a paste composition for an electrode of a solar cell according to an embodiment of the present disclosure will be described in detail.

FIG. 1 is a cross-sectional view showing an example of a solar cell according to an embodiment of the present disclosure.

Referring to FIG. 1, a solar cell 100 according to the present embodiment includes a semiconductor substrate 110 including a base region 10, conductivity type regions 20 and 30, and electrodes 42 and 44 connected to the conductivity type regions 20 and 30. In addition, the solar cell 100 can further include passivation layers (insulating layers) 22 and 32 that are formed through the electrodes 42 and 44.

The semiconductor substrate 110 can be composed of a crystalline semiconductor. For example, the semiconductor substrate 110 can be composed of a single crystal or polycrystalline semiconductor (for example, a single crystal or polycrystalline silicon). In particular, the semiconductor substrate 110 can be composed of a single crystal semiconductor (for example, a single crystal semiconductor wafer, more specifically, a semiconductor silicon wafer). Thus, when the semiconductor substrate 110 is included, the solar cell 100 composes a crystalline semiconductor (for example, a single crystal semiconductor, for example, a single crystal silicon) solar cell. Thus, the crystalline semiconductor solar cell is excellent in electrical characteristics since the crystalline semiconductor solar cell is based on the semiconductor substrate 110 having high crystallinity and fewer defects.

In the semiconductor substrate 110 or on the semiconductor substrate 110, the conductivity type regions 20 and 30 that generate carriers by a photoelectric conversion action can be formed. The conductivity type regions 20 and 30 can include a first conductivity type region 20 for generating or extracting a first carrier (electron or hole) and a second conductivity type region 30 for generating or extracting a second carrier (hole or electron). In the present disclosure, terms such as first and second are only used to distinguish each other, but the present disclosure is not limited thereto.

A front surface and/or back surface of the semiconductor substrate 110 can be textured to have an unevenness having an inclined surface (a surface inclined to a front substrate or a back substrate) on an outer surface. In this case, the unevenness can have a pyramid shape having the (111) surface as the outer surface. Such unevenness can reduce the reflectance of light incident through the front surface of the semiconductor substrate 110. However, the present disclosure is not limited thereto, and it is also possible that the unevenness due to texturing is not formed on the front and back surfaces of the semiconductor substrate 110.

In the present embodiment, the first conductivity type region 20 is made of a semiconductor material (for example, silicon) having a first conductivity type dopant (p-type or n-type dopant), and the second conductivity type region 30 is made of a semiconductor material (for example, silicon)

having a second conductivity type dopant (n-type or p-type dopant), however, the present disclosure is not limited thereto. For example, the first conductivity type region 20 can have p-type, and the base region 10 and the second conductivity type region 30 can have n-type. As a result, holes having a moving speed slower than electrons can move to the front surface of the semiconductor substrate 110 instead of the back surface, thereby improving conversion efficiency. However, the present disclosure is not limited thereto, and the base region 10 and the second conductivity type region 30 can have p-type, and the first conductivity type region 20 can have n-type.

The passivation layers 22 and 32 are formed on the conductivity type regions 20 and 30, and the electrodes 42 and 44 are connected (for example, electrical connection and physical connection) to the conductivity type regions 20 and 30 through openings 22a and 32a of the passivation layers 22 and 32. The passivation layers 22 and 32 can be made of an insulating material (for example, silicon oxide, silicon nitride, aluminum oxide, etc.) and can include a passivation layer, an anti-reflection layer, or the like. The electrodes 42 and 44 can have conductivity (electrical conductivity), including a conductive material (for example, metal).

More specifically, a first passivation layer 22 is formed on the first conductivity type region 20, and a first electrode 42 can be connected to the first conductivity type region 20 through a first opening 22a of the first passivation layer 22. A second passivation layer 32 is formed on the second conductivity type region 30, and a second electrode 44 is connected to the second conductivity type region 30 through a second opening 32a of the second passivation layer 32. However, the present disclosure is not limited thereto, and various modifications are possible, such as different structures at both surfaces.

In the above description, an example of the solar cell 100 has been described with reference to FIG. 1. However, the present disclosure is not limited thereto, and the structure, method, and the like of the solar cell 100 can be variously modified. For example, the solar cell 100 can be a photoelectric conversion unit having various structures such as using a compound semiconductor or using a dye-sensitive material.

The electrodes 42 and 44 of the solar cell 100 according to the present embodiment can be formed by firing by heat treatment after applying a paste composition for the electrodes of the solar cell (hereinafter, paste composition) on the passivation layers 22 and 32. Hereinafter, after describing the paste composition, the electrodes 42 and 44 of the solar cell 100 formed by applying and firing the paste composition will be described in detail.

The paste composition according to the present embodiment can include a conductive powder, an organic vehicle, an inorganic composition, and can further include other additives and the like. Here, the organic vehicle can include a solvent and a binder. The conductive powder is electrically connected by firing to impart conductivity to the electrodes 42 and 44. The solvent is a medium that allows the binder to be uniformly distributed, and the binder can serve to disperse and bind the conductive powder and the inorganic composition, to adjust the viscosity, and to impart bonding property between the paste composition and the conductivity type regions 20 and 30 before firing after application of the paste composition. The inorganic composition serves to etch the passivation layers 22 and 32, to promote sintering of the conductive powders during firing, and to improve adhesion and lower resistance between the electrodes 42 and 44 and the conductivity type regions 20 and 30 by inducing adhesion with the conductivity type regions 20 and 30. For example, the inorganic composition in the present embodiment can be formed of a glass frit, and hereinafter, the glass frit will be described as an example. However, the present disclosure is not limited thereto, and the inorganic composition can be provided in a crystalline form.

The conductive powder can include metal powder, for example, can include silver (Ag) powder, aluminum (Al) powder, and the like. In particular, when the conductive powder is composed of the silver powder, the electrodes 42 and 44 have excellent conductivity and also have excellent adhesion characteristics with ribbons, interconnects and the like that are connected to the electrodes 42, 44 of the external or other solar cell 100. The conductive powder can have various shapes such as a spherical shape or a non-spherical shape (a plate, bell or flake shape). As the conductive powder, single particles can be used, or particles having different particle diameters, materials and the like can be mixed and used.

The organic vehicle can be the binder dissolved in the solvent. As the solvent, organic solvents such as terpineol and carbitol can be used. As the binder, an organic binder can be used, for example, a cellulose-based binder can be used.

In the present embodiment, the inorganic composition can be formed to include a plurality of metal compounds which are compounds of metals and nonmetals. For example, the plurality of metal compounds can be composed of metal oxides which are compounds of metals and oxygen, respectively. In this case, the inorganic composition can be composed of an oxygen polyhedron having a random network structure including a plurality of metals and oxygen. When the plurality of metal compounds each are provided with a metal oxide, it is possible to easily and stably form a glass or a network structure.

In the present disclosure, that the inorganic composition can be formed to include a metal compound or a metal oxide means that the inorganic composition is formed with at least a part of a compound structure including the plurality of metals including the corresponding metal, and the corresponding nonmetals or oxygen, the random network structure, and the glass structure, etc. manufacturing the inorganic composition using the corresponding metal compound or metal oxide. Therefore, it distinguishes from a case where a compound structure in which the metal compound or the metal oxide, etc. are added as an additive separate from the inorganic composition to include the plurality of metals, the random network structure, the glass structure are not formed or provided. On the other hand, as described above, at least a part of the inorganic composition can have a crystalline state. For example, in the case of including lead oxide and gallium oxide, when heat-treated and cooled at a predetermined temperature and time, at least a part of the inorganic composition can be provided with a crystalline part and have the random network structure or the inorganic composition can be composed of the crystalline part.

At this time, the inorganic composition can include a network former, and can include a network modifier, an intermediate, or another material. The network former can mean a material forming a network structure in the inorganic composition of a paste, and the network modifier can mean a material that cuts the network structure to lower the firing temperature. In addition, the intermediate, in some cases, acts as the network former or the network modifier, but can mean a material which need not form the inorganic composition by itself.

More specifically, the plurality of metal compounds included in the inorganic composition includes a gallium compound including gallium (Ga). The plurality of metal compounds can further include a lead compound including lead (Pb). For example, the gallium compound can be gallium oxide (GaOx, for example, $Ga_2O_3$), and the lead compound can be lead oxide (PbOy, for example, PbO). In the present embodiment, the gallium compound can be a component of a main network former, which can also include the lead compound as another component in the main network former which is included in a largest amount (largest weight portion) in the inorganic composition. Accordingly, the inorganic composition can be composed of a $PbO\text{—}Ga_2O_3$ based material. For example, a sum of a weight portion of the gallium compound and a weight portion of the lead compound can be 55 or more for a total of 100 weight portion of the inorganic composition. In this range, it can fully serve as the main network former. For example, the sum of the weight portion of the gallium compound and the weight portion of the lead compound can be 55 to 85 (for example, 60 to 85) for the total of 100 weight portion of the inorganic composition. When the sum of the weight portion of the gallium compound and the weight portion of the lead compound is 60 or more, the role as the main network former can be more effectively performed. When the sum of the weight portion of the gallium compound and the weight portion of the lead compound exceeds 85, effects by other materials included in the inorganic composition can be not sufficient. In embodiments, reference to a weight portion can include a weight percentage.

The lead compound is a material capable of effectively etching the passivation layers 22 and 32 during firing without increasing the melting point or firing temperature of the paste composition. However, the lead compound alone is difficult to contribute to the formation of glass or network structure, and when a large amount is included, the conductivity type regions 20 and 30 or the semiconductor substrate 110 can be excessively etched by the over-firing reaction, so that the efficiency characteristic of the solar cell 10 can be made unstable. In addition, environmental pollutants can be a problem of environmental pollution.

In the present embodiment, by using some of the gallium compound instead of the lead compound, it can reduce the weight portion of the lead compound. The gallium compound is a material that does not significantly increase the firing temperature and can be used together with the lead compound to stably form the glass or network structure. In addition, the gallium compound can significantly improve the stability and efficiency of the solar cell 100 by reducing the over-firing reaction of the lead compound.

In the present embodiment, the weight portion of the lead compound can be equal to or greater than the weight portion of the gallium compound in the inorganic composition. In particular, the weight portion of the lead compound can be greater than the weight portion of the gallium compound in the inorganic composition. Accordingly, the passivation layers 22 and 32 are effectively etched in the firing process by the lead compound, so that the openings 22a and 32a can be stably formed, and the melting point or the firing temperature of the paste composition can be effectively lowered.

For example, in the inorganic composition, when the sum of the weight portion of the gallium compound and the weight portion of the lead compound is a 100 weight portion, the weight portion of the gallium compound can be 1 to 50 and the weight portion of the lead compound can be 50 to 99. When the weight portion of the gallium compound described above is less than 1 or the weight portion of the lead compound described above exceeds 99, the effect by the gallium compound can be not sufficient, and problems such as over-firing reaction and environmental pollution by the lead compound can occur. When the weight portion of the gallium compound described above exceeds 50 or the weight portion of the lead compound is less than 50, since the amount of the lead compound is not sufficient, etching of the passivation layers 22 and 32 may not occur sufficiently, so that the openings 22a and 32a can be not stably formed. In the inorganic composition, when the sum of the weight portion of the gallium compound and the weight portion of the lead compound is the 100 weight portion, the weight portion of the gallium compound can be 5 to 30 and the weight portion of the lead compound can be 70 to 95. In this range, the effect by the gallium compound and lead compound can be stably implemented.

Alternatively, the weight portion of the gallium compound for the total of 100 weight portion of the inorganic composition can be 1 to 50, more specifically 5 to 30. When the weight portion of the gallium compound is less than 1 for the total of 100 weight portion of the inorganic composition, the effect by the gallium compound can be not sufficient, and when the weight portion of the gallium compound for the total of 100 weight portion of the inorganic composition exceeds 50, the amount of lead compound or other material is not sufficient, so that the etching of the passivation layers 22 and 32 may not occur sufficiently or it can be difficult to sufficiently improve other characteristics. In particular, when the weight portion of the gallium compound is 5 to 30 for the total of 100 weight portion of the inorganic composition, the effects on the gallium compound, the lead compound, and other materials can be maximized. At this time, the weight portion of the lead compound for the total of 100 weight portion of the inorganic composition can be 30 to 90, more specifically 50 to 80. When the weight portion of the lead compound is less than 30 for the total of 100 weight portion of the inorganic composition, since the amount of the lead compound is not sufficient, the etching of the passivation layers 22 and 32 may not occur sufficiently, so that the openings 22a and 32a can be not stably formed. When the weight portion of the lead compound exceeds 90 for the total of 100 weight portion of the inorganic composition, problems such as over-firing reaction and environmental pollution by the lead compound can occur. When the weight portion of the lead compound is 50 to 80 for the total of 100 weight portion of the inorganic composition, the effect by the gallium compound, the lead compound, and another material (additional compound) can be implemented stably.

In the above description, it is described as an example that the weight portion of the lead compound is equal to or greater than the weight portion of the gallium compound. However, the present disclosure is not limited thereto. Therefore, the weight portion of the gallium compound is greater than the weight portion of the lead compound in the inorganic composition, so that it can effectively prevent the over-firing reaction to further improve the stability. In addition, in the above description, an example in which the inorganic composition includes the gallium compound together with the lead compound is illustrated, but even when the lead compound is not included, the inorganic composition can include the gallium compound. Even in this case, the gallium compound can implement the effect of effectively forming the glass or network structure without significantly increasing the firing temperature.

The plurality of metal compounds constituting the inorganic composition can further include an additional metal compound other than the gallium compound and the lead compound. In the plurality of metal compounds, the remainder (or the rest) other than the gallium compound and the lead compound can be composed of the additional metal compound. As described above, since the sum of the weight portion of the gallium compound and the weight portion of the lead compound is 55 or more (for example, 55 to 85, for example, 60 to 85) for the total of 100 weight portion of the inorganic composition, the additional metal compound can be included in an amount of 45 or less (for example, 15 to 45, for example, 15 to 40) in a weight portion for the total of 100 weight portion of the inorganic composition.

For example, the weight portion of the gallium compound can be greater than the weight portion of each of the additional metal compound. That is, the additional metal compound can include a first metal compound included in a largest weight portion among the additional metal compound, and the weight portion of the gallium compound can be greater than the weight portion of the first metal compound. When there is one additional metal compound, the one additional metal compound becomes the first metal compound, and when there are a plurality of additional metal compounds, the additional metal compound having the largest weight portion among the plurality of additional metal compounds becomes the first metal compound. For example, the weight portion of the first metal compound can be 5 to 20 for a total of 100 weight portion of the gallium compound.

For example, the additional metal compound can include silicon oxide (e.g. $SiO_2$), boron oxide (e.g. $B_2O_3$), aluminum oxide (e.g., $Al_2O_3$), zinc oxide (e.g. ZnO), alkali metal oxide, bismuth oxide (e.g. $Bi_2O_3$), and the like. The alkali metal oxide can include sodium oxide (e.g. $Na_2O$), lithium oxide (e.g. $Li_2O$), potassium oxide (e.g. $K_2O$), or the like. In addition, the alkali metal oxide can further include phosphorus oxide (e.g. $P_2O_5$), cobalt oxide (e.g. $Co_3O_4$), manganese oxide ($MnO_2$), titanium oxide ($TiO_2$), vanadium oxide ($V_2O_5$), and the like.

The silicon oxide is one of the network formers, serves to effectively form the network structure and is excellent in moisture resistance, acid resistance and corrosion resistance. The boron oxide is one of the network formers, and serves to form the network structure. Since the boron oxide does not increase the firing temperature higher than that of silicon oxide, the boron oxide can be included in the inorganic composition so as not to increase the firing temperature while participating as the network former. However, the boron oxide is vulnerable to moisture and is not excellent in moisture resistance, acid resistance, and corrosion resistance, but boron oxide can be included with the silicon oxide for control of the firing temperature. The aluminum oxide, as an intermediate, serves to improve moisture resistance, acid resistance and corrosion resistance while controlling the firing temperature.

As an example, the additional metal compound can include silicon oxide, and can include at least one of boron oxide and aluminum oxide. For example, the additional metal compound can lower the firing temperature of the paste composition while improving moisture resistance, acid resistance and corrosion resistance while effectively forming the network structure by including the silicon oxide and the boron oxide together. Alternatively, the additional metal compound can effectively improve moisture resistance, acid resistance and corrosion resistance while effectively forming the network structure by including the silicon oxide and the aluminum oxide together. However, this is only an example, and various modifications are possible, such as not including silicon oxide, boron oxide, and aluminum oxide.

Zinc oxide, as an intermediate, helps to form lead oxide glass, or helps to make glass that is stable against low thermal characteristics because it can also form some network structures with other materials when added above a predetermined amount.

Alkali metal oxides such as lithium, sodium, potassium, and the like, as one of modifiers to modify the network structure, generally has the effect of lowering the firing temperature by cutting the network structure. Bismuth oxide can, as an intermediate, serve to form a network structure, improve the network structure, or modify the network structure with being present together with a specific material. In the case where an inorganic composition (glass composition) including bismuth oxide, which is generally used to make a glass composition of low thermal properties, is used in the paste composition, the firing temperature of the paste composition can be lowered. Phosphorus oxide is one of the network formers, and serves to form a network structure. Since phosphorus oxide does not increase the firing temperature higher than silicon oxide, the phosphorus oxide can be included in the inorganic composition so as not to significantly increase the firing temperature while including the network former.

Cobalt oxide, manganese oxide, or titanium oxide can be included to impart the desired color to the paste composition. For example, the paste composition including cobalt oxide can be blue, the paste composition including manganese oxide can be gray, and the paste composition including titanium oxide can be white. In addition, cobalt oxide, manganese oxide, or titanium oxide can also serve to prevent a large drop in viscosity at high temperatures.

Vanadium oxide can be included with specific components depending on the conditions to form a network structure. The vanadium oxide can make the inorganic composition (glass composition) with a significantly lower firing temperature than silicon oxide, and thus can be used to lower the firing temperature of the paste composition. For example, in the present embodiment, the inorganic composition need not include tellurium oxide (e.g., $TeO_2$). Tellurium oxide can be included with lead oxide to lower the melting point or firing temperature of the paste composition, but for this purpose it should be included as a high weight portion (e.g., 25 weight portion or more). Tellurium oxide can significantly increase the cost of the paste composition when it is included as the high weight portion because it is expensive, and has a problem that is not advantageous for glass or network structure formation. Since the present embodiment can stably form a glass or network structure while maintaining a low melting point or firing temperature by the gallium oxide, it is not necessary to separately include the tellurium oxide. However, the present disclosure is not limited thereto, and the tellurium oxide can be included as one of additional oxides. Many other variations are possible.

In this case, when silicon oxide is included, the silicon oxide can be included in 1 to 10 weight portions for the total of 100 weight portion of the inorganic composition and the additional metal compound. In addition, when bismuth oxide is included, the bismuth oxide can be included in 1 to 10 weight portions for the total of 100 weight portion of the inorganic composition and the additional metal compound. When zinc oxide is included, the zinc oxide can be included in 1 to 10 weight portions for the total of 100 weight portion of the inorganic composition and the additional metal compound. Within this range, the effects of the above-described materials each can be stably implemented.

The above-described inorganic composition can have a low glass transition temperature of 400° C. or less (e.g., 200 to 400° C.). This is because the inorganic composition can keep the glass transition temperature at a low level through that the gallium oxide is formed as the main network former with the lead oxide. Accordingly, it is possible to lower the glass transition temperature while reducing the glass instability by lowering the content of lead oxide. Accordingly, the melting point of the paste composition according to the present embodiment can be maintained at a low level of about 400 to 500° C., and the paste composition can be fired at relatively low firing temperatures, such as 700 to 800° C. However, the present disclosure is not limited thereto, and the glass transition temperature of the inorganic composition, the melting point and firing temperature of the paste composition, and the like can have different values.

The above-described inorganic composition can be formed by mixing powders of a plurality of metal compounds (for example, lead oxide, gallium oxide, and additional metal compound) constituting the same, and then melting the mixed powders, and then cooling them to a state having a predetermined form and then grinding them. For example, a glass frit in a form of a plate is manufactured by mixing powders of the plurality of metal compounds, melting them at a temperature of 1000 to 1300° C., dropping them into drops, and passing them between two rolls, and then the plate of the glass frit can be grinded.

The glass frit manufactured as above can have a central particle diameter (D50) of 3 μm or less (e.g., 0.5 μm to 3 μm), and for example, it can have a central particle diameter of 0.5 μm to 2 μm (more specifically, 0.5 μm to 2.5 μm). A glass frit having a particle diameter of less than 0.5 μm can be difficult to be manufactured, but the glass frit of less than 0.5 μm can be used if there is no manufacturing difficulty. When the central particle diameter of the glass frit exceeds 3 μm, the maximum particle diameter of the glass frit becomes large so that the glass frit is not easily vitrified during firing, and thus the fluidity can be not good, and the maximum particle diameter (Dmax) distribution also relatively becomes large, which can adversely affect the printing performance of the paste composition. The central particle diameter of the glass frit can be 3 μm or less, more specifically, 2.5 μm or less so that the glass frit and the paste composition including the same can have more excellent characteristics. However, the present disclosure is not limited thereto, and various modifications are possible.

The paste composition can further include a thixotropic agent, a leveling agent, an antifoaming agent, a dispersing agent, and the like as an additive. As the thixotropic agent, polymers/organic materials such as urea-based, amide-based, urethane-based, etc. can be used, or inorganic silica and the like can be used. As the leveling agent, the antifoaming agent, the dispersing agent, and the like, various known materials can be used. The additive can be added to the organic vehicle or can be added separately from the organic vehicle.

In the present embodiment, the conductive powder can be included in 0.1 to 10 weight portion for a total of 100 weight portion of the paste composition, and the inorganic composition can be included in 0.1 to 10 weight portion for a total of 100 weight portion of the conductive powder. The additive can be included in 0 to 5 weight portion for the total of 100 weight portion of the paste composition, and the organic vehicle can be included in the remainder (or the rest) of the paste composition.

Thus, the electrode 42, 44 formed by using the paste composition including the conductive powder as a main component can have excellent electrical conductivity. When the conductive powder is included in less than 70 weight portion, the electrical conductivity of the electrodes 42 and 44 can be not sufficient. When the conductive powder is more than 90 weight portion, the content of other materials constituting the paste composition can be reduced, thereby degrading adhesion characteristics with the conductivity type regions 20 and 30. For example, the conductive powder can be included in 80 to 90 weight portion for the total of 100 weight portion of the paste composition, so that the electrodes 42 and 44 can have sufficient electrical conductivity. In addition, the inorganic composition can be included in 0.1 to 10 weight portion for the total of 100 weight portion of the conductive powder, so that the adhesion of the electrodes 42 and 44 can be improved and the resistance can be lowered by improving the firing characteristics and the sintering characteristics. However, the present disclosure is not limited thereto, and the conductive powder, the inorganic composition, the weight portion of the additive, and the like can be variously modified.

The paste composition can be manufactured by the following method.

The binder is dissolved in the solvent and then premixed to form the organic vehicle. The conductive powder, inorganic composition and additive are added to the organic vehicle and aged for a period of time. The aged mixture is mechanically mixed and dispersed through a 3 roll mill or the like. The mixture is filtered and defoamed to manufacture the paste composition. However, this method is only presented as an example and the present disclosure is not limited thereto.

The manufacturing method of the solar cell 100 using the paste composition described above is as follows.

The conductivity type regions 20 and 30 and the passivation layers 22 and 32 are formed in the semiconductor substrate 10. Various methods can be used to form the conductivity type regions 20 and 30 and the passivation layers 22 and 32.

The paste composition according to the present embodiment is applied on the conductivity type regions 20 and 30 and the passivation layers 22 and 32 by various methods (for example, screen printing, etc.), and then fired and the electrodes 42 and 44 connected to the conductivity type regions 20 and 30 are formed.

During firing of the paste composition, the organic vehicle, additive, etc. are volatilized or removed by the heat applied during the firing, so that the metal (especially, silver) and inorganic composition formed by firing the conductive powder mainly remain in the electrodes 42 and 44. During firing of the paste composition, the paste composition can penetrate the passivation layers 22 and 32 by fire-through. Accordingly, when the paste composition is applied onto the passivation layers 22 and 32 where the openings 22a and 32a are not formed and then fired, the paste composition penetrates the passivation layers 22 and 32 to form the openings 22a and 32a. Accordingly, the electrodes 42 and 44 are fired in contact with the conductivity type regions 20 and 30. Accordingly, a separate patterning process for forming the openings 22a and 32a can be not provided, thereby simplifying the manufacturing process.

Accordingly, the metal (particularly, silver) can be included in 90 (J) to 99.5 (K) weight portion, and the inorganic composition can be 0.5 (L) to 10 (M) weight portion for a total of 100 weight portion of the electrodes 42 and 44. A weight portion of each material for the total of 100 weight portion of the above-described inorganic composition can be maintained on the electrodes 42 and 44 as they are. For example, the gallium/gallium compound can be included in 0.005 to 10 (for example, 0.5 (N) to 10, for example, 0.5 to 5) weight portion for the total of 100 weight portion of the electrodes 42 and 44.

For reference, whether the gallium or the gallium compound is included in the electrodes 42 and 44 can be determined by a method such as X-ray diffraction (XRD) analysis. Whether the gallium compound is included in the inorganic composition or is included separately from the inorganic composition as an additive can be determined by a component analysis method. For example, it can be determined by energy dispersive spectrometer (EDS), X-ray fluorescence (XRF), inductively coupled plasma mass spectrometry (ICP-MS), or the like.

As described above, in the present embodiment, the paste composition or the inorganic composition of the electrodes 42 and 44 formed thereby includes the gallium compound, so that the paste composition is resistant to a degree of highly raising the firing temperature, and can form glass stably. Accordingly, the adhesion between the electrodes 42 and 44 and the conductivity type regions 20 and 30 can be improved to lower the resistance of the electrodes 42 and 44. At this time, when the inorganic composition includes the gallium compound together with the lead compound, the passivation layers 22 and 32 can be effectively etched so that the openings 22a and 32a can be stably formed, but the over-firing reaction of the lead compound can be prevented, thereby improving stability, and environmental pollution by the lead compound can be reduced. In addition, the solar cell 100 including the electrodes 42 and 44 manufactured using the paste composition can have excellent stability and uniform efficiency characteristics.

The paste composition according to the present embodiment can be applied to at least one of the first electrode 42 and the second electrode 44 of the solar cell 100. In particular, the effect can be doubled by being applied to the electrodes 42 and 44 (for example, the first electrode 42) connected to p-type conductivity type regions 20 and 30. This is because in a case where the inorganic composition includes tellurium oxide, when used for an electrode connected to n-type conductivity type regions, it has excellent characteristics, however when used for an electrode connected to the p-type conductivity type regions, the characteristics are not excellent, the paste composition according to the present embodiment has excellent characteristics even when connected to the p-type conductivity type regions 20 and 30. However, the present disclosure is not limited thereto. It can be used for the electrodes 42 and 44 connected to the n-type conductivity type regions 20 and 30. Many other variations are possible.

Hereinafter, the present disclosure will be described in more detail with reference to manufacturing examples of the present disclosure. However, the manufacturing examples to be described below are merely for illustrating the embodiments of the present disclosure, and the present disclosure is not limited thereto.

Manufacturing Example 1

An organic vehicle was prepared by dissolving a binder in a solvent. Butyl carbitol was used as the solvent, and a cellulose binder was used as the binder. The conductive powder and the inorganic composition were added to the organic vehicle and then mixed. As the inorganic composition, a glass frit including 38.8 weight portion of $Ga_2O_3$, 57.8 weight portion of PbO, 1.6 weight portion of $SiO_2$, and 1.8 weight portion of $B_2O_3$ was used for a total of 100 weight portion. After aging for 12 hours, the mixture was secondly mixed and dispersed using a 3 roll mill, filtered and defoamed to form a paste composition. At this time, the paste composition included 86 weight portion of the conductive powder, 11.5 weight portion of the organic vehicle, and 3.5 weight portion of the inorganic composition.

This paste composition was applied on a semiconductor substrate having a conductivity type region by a printing method and then fired to form an electrode.

Manufacturing Example 2

Except for the composition of the inorganic composition, the electrode was formed in the same manner as in Manufacturing Example 1. As the inorganic composition, a glass frit including 28.6 weight portion of $Ga_2O_3$, 68.1 weight portion of PbO, 1.53 weight portion of $SiO_2$, and 1.77 weight portion of $B_2O_3$ was used for a total of 100 weight portion.

Manufacturing Example 3

Except for the composition of the inorganic composition, the electrode was formed in the same manner as in Manufacturing Example 1. As the inorganic composition, a glass frit including 18.7 weight portion of $Ga_2O_3$, 78.3 weight portion of PbO, 1.5 weight portion of $SiO_2$, and 1.7 weight portion of $B_2O_3$ was used for a total of 100 weight portion.

Manufacturing Example 4

Except for the composition of the inorganic composition, the electrode was formed in the same manner as in Manufacturing Example 1. As the inorganic composition, a glass frit including 9.2 weight portion of $Ga_2O_3$, 87.6 weight portion of PbO, 1.5 weight portion of $SiO_2$, and 1.7 weight portion of $B_2O_3$ was used for a total of 100 weight portion.

Manufacturing Example 5

Except for the composition of the inorganic composition, the electrode was formed in the same manner as in Manufacturing Example 1. As the inorganic composition, a glass frit including 2.06 weight portion of $Ga_2O_3$, 68.1 weight portion of PbO, 5 weight portion of ZnO, 3 weight portion of $Al_2O_3$, 1.53 weight portion of $SiO_2$, and 1.77 weight portion of $B_2O_3$ was used for a total of 100 weight portion.

Comparative Example 1

Except for the composition of the inorganic composition, the electrode was formed in the same manner as in Manufacturing Example 1. As the inorganic composition, a glass frit including 96.87 weight portion of PbO, 1.45 weight portion of $SiO_2$, and 1.67 weight portion of $B_2O_3$ was used for a total of 100 weight portion.

Figure 2:
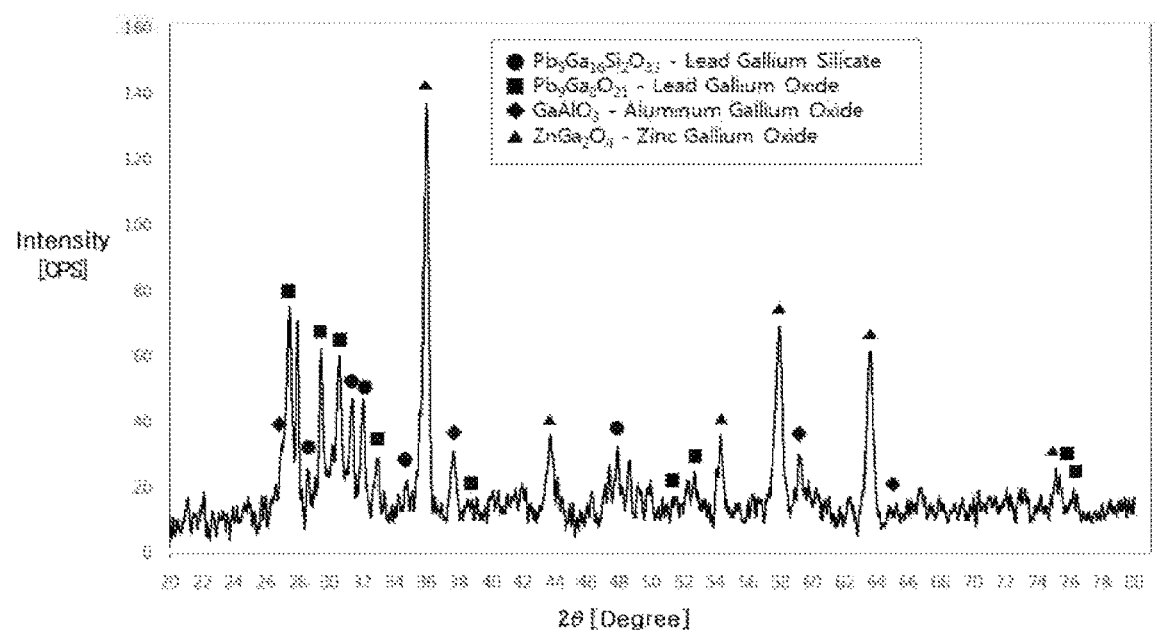
FIG. 2 is a graph showing results of performing X-ray diffraction analysis on electrodes formed according to Manufacturing Example 5.
Figure 3:
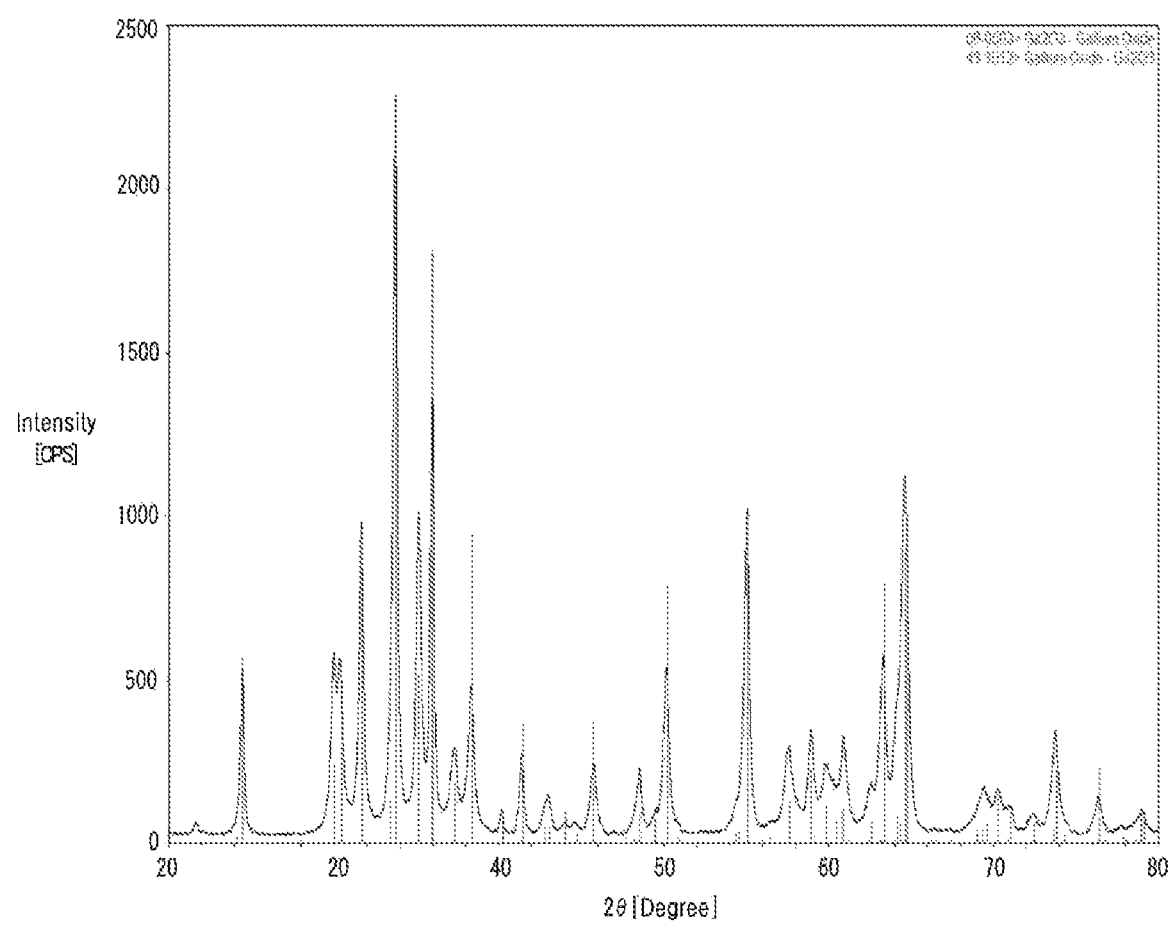
FIG. 3 shows the results of performing an X-ray diffraction analysis to make an electrode with a paste composition in which gallium oxide is added separately from the glass frit.

X-ray diffraction analysis (XRD) was performed on the electrode formed according to Manufacturing Example 5 and the results are shown in FIG. 2. For reference, FIG. 3 shows the results of performing an X-ray diffraction analysis to make an electrode with a paste composition in which gallium oxide is added separately from the glass frit.

Figure 4:
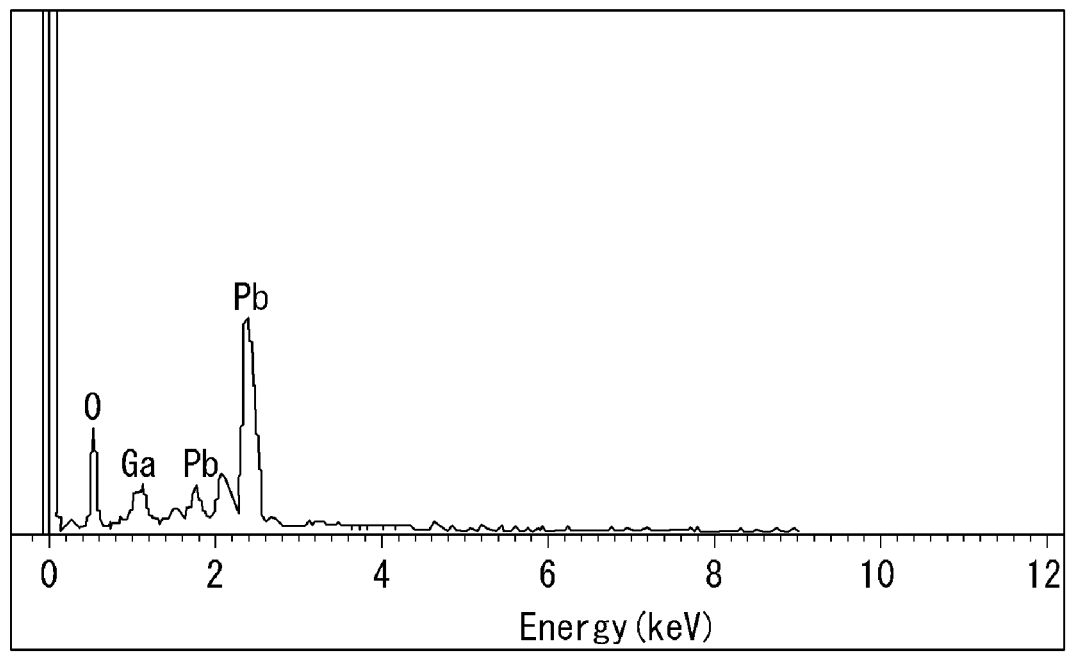
FIG. 4 is a graph showing results of performing energy dispersive analysis on electrodes formed according to Manufacturing Example 1.
Figure 5:
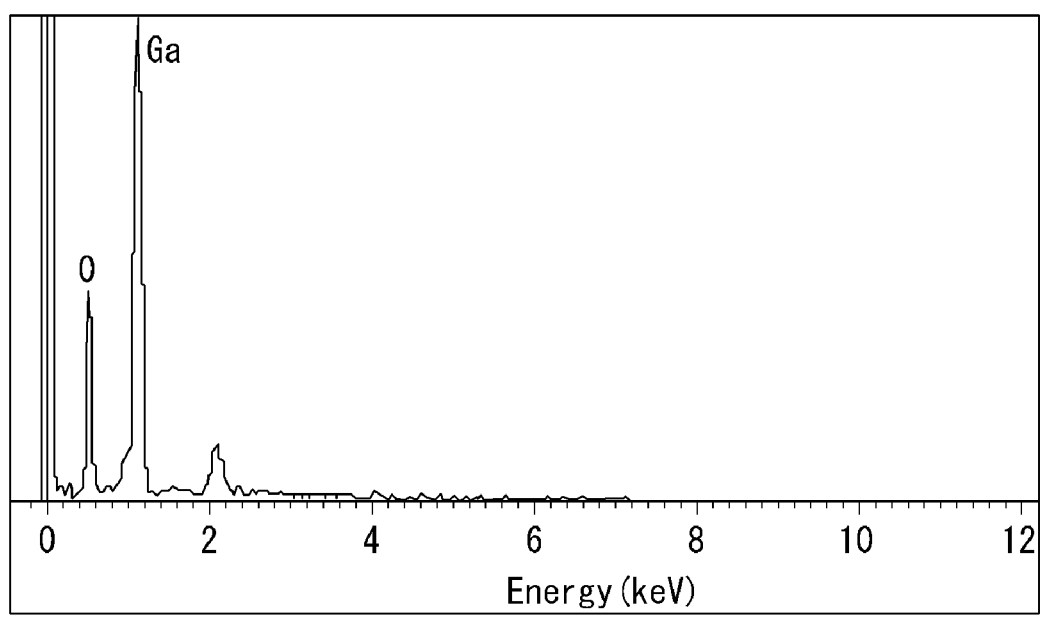
FIG. 5 is a graph showing results of performing energy dispersive analysis to make an electrode with a paste composition in which gallium oxide is added separately from the glass frit.

Energy dispersive analysis (EDS) was performed at specific positions of the electrodes formed according to Manufacturing Example 1, and the results are shown in FIG. 4. For reference, FIG. 5 is a graph showing results of performing energy dispersive analysis to make an electrode with a paste composition in which gallium oxide is added separately from the glass frit.

The melting point of the conductive paste composition and the resistance of the electrode of the solar cell according to Manufacturing Examples 1 to 4 and Comparative Example 1 and were measured, and the results are shown in Table 1. In Table 1, relative values at 100% of the melting point and the resistance according to Comparative Example 1 are described.

TABLE 1

|  | Resistance (relative value) [%] | Efficiency (relative value) [%] |
| --- | --- | --- |
| Comparative Example 1 | 100 | 100 |
| Manufacturing Example 1 | 110 | 99.6 |
| Manufacturing Example 2 | 93 | 100.2 |
| Manufacturing Example 3 | 76 | 100.8 |
| Manufacturing Example 4 | 84 | 100.5 |

Referring to FIG. 2, in Manufacturing Example 5, in the X-ray diffraction analysis, it can be seen that $Pb5Ga_{16}Si_2O_{33}$ peaks, $Pb_9Ga_8O_{21}$ peaks, $GaAlO_3$ peaks, $ZnGa_2O_4$ peaks, and the like are provided in addition to $Ga_2O_3$, so that gallium oxide is included as the glass frit together with lead oxide, silicon oxide, aluminum oxide, zinc oxide and the like. On the other hand, referring to FIG. 3, when gallium oxide is included as a separate additive, it can be seen that only the $Ga_2O_3$ peak is provided, so that gallium oxide is not included as the glass frit. That is, X-ray diffraction analysis can be performed on the electrode of the solar cell to determine whether the $Ga_2O_3$ peak is provided alone, so that it can be confirmed whether $Ga_2O_3$ is included as the glass frit in the electrode or the inorganic composition.

Referring to FIG. 4, in Manufacturing Example 1, in the energy dispersive analysis, it can be seen that the peak of lead is provided together with the peaks of gallium and oxygen, so that the gallium oxide is included as the glass frit together with lead oxide and the like. On the other hand, referring to FIG. 5, when the gallium oxide is included as a separate additive, it can be seen that only the peaks of gallium and oxygen are provided, so that gallium oxide is not included as the glass frit.

Referring to Table 1, it can be seen that the paste composition according to Manufacturing Examples 1 to 4 has a very low resistance while having a similar melting point as the paste composition according to Comparative Example 1. This is expected to lower the resistance by forming glass stably while suppressing the over-firing reaction of PbO while $Ga_2O_3$ is included in the inorganic composition to keep the melting point low. Accordingly, according to Manufacturing Examples 1 to 4, the efficiency of the solar cell can be greatly improved. In particular, excellent effects can be obtained in Manufacturing Examples 2 to 4 in which the weight portion of $Ga_2O_3$ is 1 to 30 (e.g., 5 to 30), in particular, Manufacturing Examples 3 and 4 in which the weight portion of $Ga_2O_3$ is 1 to 20 (e.g., 5 to 20) out of a total of 100 weight portion of the inorganic composition.

The features, structures, effects and the like according to the above-described embodiments are included in at least one embodiment of the present disclosure, and are not necessarily limited to only one embodiment. Furthermore, the features, structures, effects, and the like illustrated in the embodiments can be combined or modified in other embodiments by those skilled in the art to which the embodiments belong. Accordingly, contents related to these combinations and modifications should be construed as being included in the scope of the present disclosure.

What is claimed is:

1. A solar cell including a glass composition, the solar cell comprising:
    a semiconductor substrate including a base region having a n-type dopant;
    a conductivity type region having a p-type dopant, and formed in or on the semiconductor substrate; and
    an electrode connected to the conductivity type region,
    wherein the electrode includes a Ag material and the glass composition including gallium oxide and lead oxide,
    wherein the glass composition further includes an addition metal compound other than gallium oxide and lead oxide,
    wherein a sum weight portion of lead oxide and gallium oxide is larger than a weight portion of the additional metal compound,
    wherein the additional metal compound includes at least one of silicon oxide, boron oxide, aluminum oxide, zinc oxide, alkali metal oxide, bismuth oxide, but not tellurium oxide,
    wherein a weight portion of lead oxide is equal to or greater than a weight portion of gallium oxide in the glass composition,
    wherein the weight portion of gallium oxide is larger than a weight portion of a first metal compound having a largest weight portion among the additional metal compound, and
    wherein the weight portion of the gallium oxide is 0.005 to 10 of a total of 100 weight portion of the electrode.

2. The solar cell of claim 1, wherein gallium oxide is included as a component of a main network former of the glass composition.

3. The solar cell of claim 1, wherein the glass composition has a melting temperature of about 400 to 500° C.

4. The solar cell of claim 1, wherein, when a sum of the weight portion of gallium oxide and the weight portion of the lead oxide is a total of 100 weight portion of the sum, the weight portion of gallium oxide is 5 to 30 of the sum and the weight portion of the lead oxide is 70 to 95 of the sum.

5. The solar cell of claim 1, wherein the weight portion of the gallium oxide is 5 to 30 for a total of 100 weight portion of the glass composition that includes the gallium oxide, the lead oxide, and the additional metal compound.

* * * * *